United States Patent
Chae

(10) Patent No.: US 7,802,123 B2
(45) Date of Patent: Sep. 21, 2010

(54) DATA PROCESSING APPARATUS AND METHOD USING FIFO DEVICE

(75) Inventor: Kwan-Yeob Chae, Seoul (KR)

(73) Assignee: Samsung Electronics Co., Ltd. (KR)

( * ) Notice: Subject to any disclaimer, the term of this patent is extended or adjusted under 35 U.S.C. 154(b) by 670 days.

(21) Appl. No.: 11/811,726

(22) Filed: Jun. 12, 2007

(65) Prior Publication Data

US 2007/0297250 A1 Dec. 27, 2007

(30) Foreign Application Priority Data

Jun. 27, 2006 (KR) .................... 10-2006-0057893

(51) Int. Cl.
*G06F 1/12* (2006.01)
*G06F 1/14* (2006.01)
*G06F 13/42* (2006.01)

(52) U.S. Cl. ................. 713/400; 713/401; 713/500; 713/503; 713/600; 711/147; 711/167

(58) Field of Classification Search ........... 713/400, 713/401, 500, 503, 600; 711/147, 167
See application file for complete search history.

(56) References Cited

U.S. PATENT DOCUMENTS

| | | | |
|---|---|---|---|
| 6,469,852 B1 | 10/2002 | Nakagawa | |
| 6,519,107 B1 | 2/2003 | Ehrlich et al. | |
| 6,629,250 B2* | 9/2003 | Kopser et al. | 713/401 |
| 6,708,261 B1* | 3/2004 | Shin et al. | 711/167 |
| 6,912,680 B1* | 6/2005 | Keeth | 714/736 |
| 7,493,461 B1* | 2/2009 | Thorne | 711/167 |

FOREIGN PATENT DOCUMENTS

JP 2004-005814 1/2004

* cited by examiner

*Primary Examiner*—Thomas Lee
*Assistant Examiner*—Michael J Brown
(74) *Attorney, Agent, or Firm*—Mills & Onello, LLP

(57) ABSTRACT

In a data processing apparatus and method using a first-in first-out (FIFO), the data processing apparatus includes a first sampling circuit, a delay circuit, and a FIFO device. The first sampling circuit samples a logic state of input data in response to a first edge of a first clock signal and holds a result of the sampling. The delay circuit receives and delays the first clock signal by a predetermined delay time and outputs a second clock signal. The FIFO device processes the result of the sampling output from the first sampling circuit using a FIFO method in response to a first edge of the second clock signal output from the delay circuit.

14 Claims, 5 Drawing Sheets

DATA PROCESSING APPARATUS AND METHOD USING FIFO DEVICE

RELATED APPLICATIONS

This application claims priority under 35 U.S.C. §119 to Korean Patent Application No. 10-2006-0057893, filed on Jun. 27, 2006, the disclosure of which is hereby incorporated by reference herein as if set forth in its entirety.

BACKGROUND OF THE INVENTION

1. Field of the Invention

The present invention relates to data processing technology, and more particularly, to a data processing apparatus and method using a first-in first-out (FIFO) device.

2. Description of the Related Art

Memory controllers that control the operations of memory devices processing data at a double data rate (DDR), such as DDR memory devices, DDR2 memory devices, DDR3 memory devices, graphics DDR (GDDR) memory devices, GDDR2 memory devices, and GDDR3 memory devices, perform a read operation by latching input data in synchronization with a clock signal generated by shifting by 90 degrees the phase of a data strobe signal output from the memory devices. In order to increase the device timing margin, it is important to control skew between data strobe signals input to clock terminals of a plurality of flip-flops, respectively, which are responsible for latching the input data, and to control skew between data signals input to input terminals of the respective flip-flops. The clock terminals and the input terminals are portions of the device at which signal skew is controlled.

With the increase of operating speed of memory devices and memory controllers, FIFO devices are commonly employed so that input and output data can be latched at a high rate. However, since a FIFO device includes a plurality of flip-flops, the number of points requiring skew control increases. As a result, it is difficult to control skew between data strobe signals input to clock terminals of the respective flip-flops and to control skew between data input to input terminals of the respective flip-flops. Moreover, when the depth of the FIFO device increases, the number of points requiring skew control also increases.

SUMMARY OF THE INVENTION

Embodiments of the present invention provide a data processing apparatus and method using a first-in first-out (FIFO) device which has a fixed number of points requiring skew control, regardless of its depth.

According to an aspect of the present invention, there is provided a data processing apparatus including a first sampling circuit, a delay circuit, and a FIFO device. The first sampling circuit samples a logic state of input data in response to a first edge of a first clock signal and holds a result of the sampling. The delay circuit delays the first clock signal by a predetermined delay time and outputs a second clock signal. The FIFO device processes the result of the sampling output from the first sampling circuit using a FIFO method in response to a first edge of the second clock signal output from the delay circuit.

The data processing apparatus can further include a second sampling circuit sampling a logic state of the input data in response to a second edge of the first clock signal and holding a result of the sampling. The FIFO device processes the result of the sampling output from the second sampling circuit using the FIFO method in response to a second edge of the second clock signal output from the delay circuit. The data processing apparatus can further include a phase shifter receiving a data strobe signal and generating the first clock signal whose phase is 90 degrees different from a phase of the data strobe signal. Each of the first sampling circuit and the second sampling circuit comprises a flip-flop.

The FIFO device can include a plurality of first edge-triggered flip-flops each of which latches data input through an input terminal in response to the first edge of the second clock signal; a write control circuit that transmits the input data to the input terminal of a corresponding one of the first edge-triggered flip-flops in response to at least one write control signal; and a read control circuit that outputs data, which is latched by the corresponding one of the first edge-triggered flip-flops, as output data in response to at least one read control signal.

The write control circuit may include a write selection signal generation circuit that outputs a plurality of write selection signals in response to the at least one write control signal, and a plurality of selection circuits. Each of the plurality of selection circuits includes a first terminal that receives the input data, a second terminal that receives data output from a corresponding flip-flop among the first edge-triggered flip-flops, and an output terminal that outputs one of the input data input to the first terminal and the data input to the second terminal to the input terminal of the corresponding one of the first edge-triggered flip-flops in response to a corresponding selection signal among the plurality of write selection signals. The data processing apparatus can be a controller that controls a device that processes data at a double data rate.

According to another aspect of the present invention, there is provided a data processing apparatus including a plurality of first flip-flops each of which latches input data, which is input through an input terminal, in response to a first edge of a first clock signal; a delay circuit that receives the first clock signal and that delays the received first clock signal by a predetermined delay time to output a second clock signal; and a FIFO device that processes data output from the plurality of first flip-flops using a FIFO method in response to a first edge of the second clock signal output from the delay circuit.

The data processing apparatus can further include a plurality of second flip-flops, the input terminals of which are respectively connected to the input terminal of the first flip-flops, each of the second flip-flops latching the input data, which is input through an input terminal, in response to a second edge of the first clock signal. At this time, the FIFO device processes data output from the second flip-flops using the FIFO method in response to a second edge of the second clock signal output from the delay circuit.

The first edge can be one of a rising edge and a falling edge and the second edge can be the other one of the rising edge and the falling edge.

According to still another aspect of the present invention, there is provided a data processing apparatus including a first flip-flop that latches a logic state of an n-th input data in response to a first edge of a first clock signal, where n is a natural number; a second flip-flop that latches a logic state of an (n+1)-th input data in response to a second edge of the first clock signal; a delay circuit that receives the first clock signal and that delays it by a predetermined delay time to output a second clock signal; and a FIFO device that processes the data, which is latched by the first flip-flop, using a FIFO method in response to a first edge of the second clock signal output from the delay circuit, and that processes the data, which is latched by the second flip-flop, using the FIFO method in response to a second edge of the second clock signal.

The FIFO device can include a plurality of first edge-triggered flip-flops each of which latches data input through an input terminal in synchronization with the first edge of the second clock signal; a plurality of second edge-triggered flip-flops each of which latches data input through an input terminal in synchronization with the second edge of the second clock signal; a write control circuit that transmits the n-th input data, which is latched by the first flip-flop, to the input terminal of at least one of the first edge-triggered flip-flops and that transmits the (n+1)-th input data, which is latched by the second flip-flop, to the input terminal of at least one of the second edge-triggered flip-flops in response to at least one write control signal; and a read control circuit that outputs data latched by one of the first edge-triggered flip-flops or data latched by one of the second edge-triggered flip-flops in response to at least one read control signal.

The data processing apparatus can further comprise a phase shifter that receives a data strobe signal and that generates the first clock signal, a phase of which is shifted 90 degrees relative to a phase of the data strobe signal.

According to yet another aspect of the present invention, there is provided a data processing method using a FIFO device. The method includes latching a logic state of input data in response to a first edge of a first clock signal using a first flip-flop, generating a second clock signal by delaying the first clock signal by a predetermined delay time using a delay circuit, and receiving data latched using the first flip-flop in response to a first edge of the second clock signal and processing the data using the FIFO device using a FIFO method.

The data processing method can further include latching the input data in response to a second edge of the first clock signal using a second flip-flop; and receiving data latched using the second flip-flop in response to a second edge of the second clock signal and processing the data using the FIFO device using the FIFO method.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF EMBODIMENTS OF THE INVENTION

Figure 1:
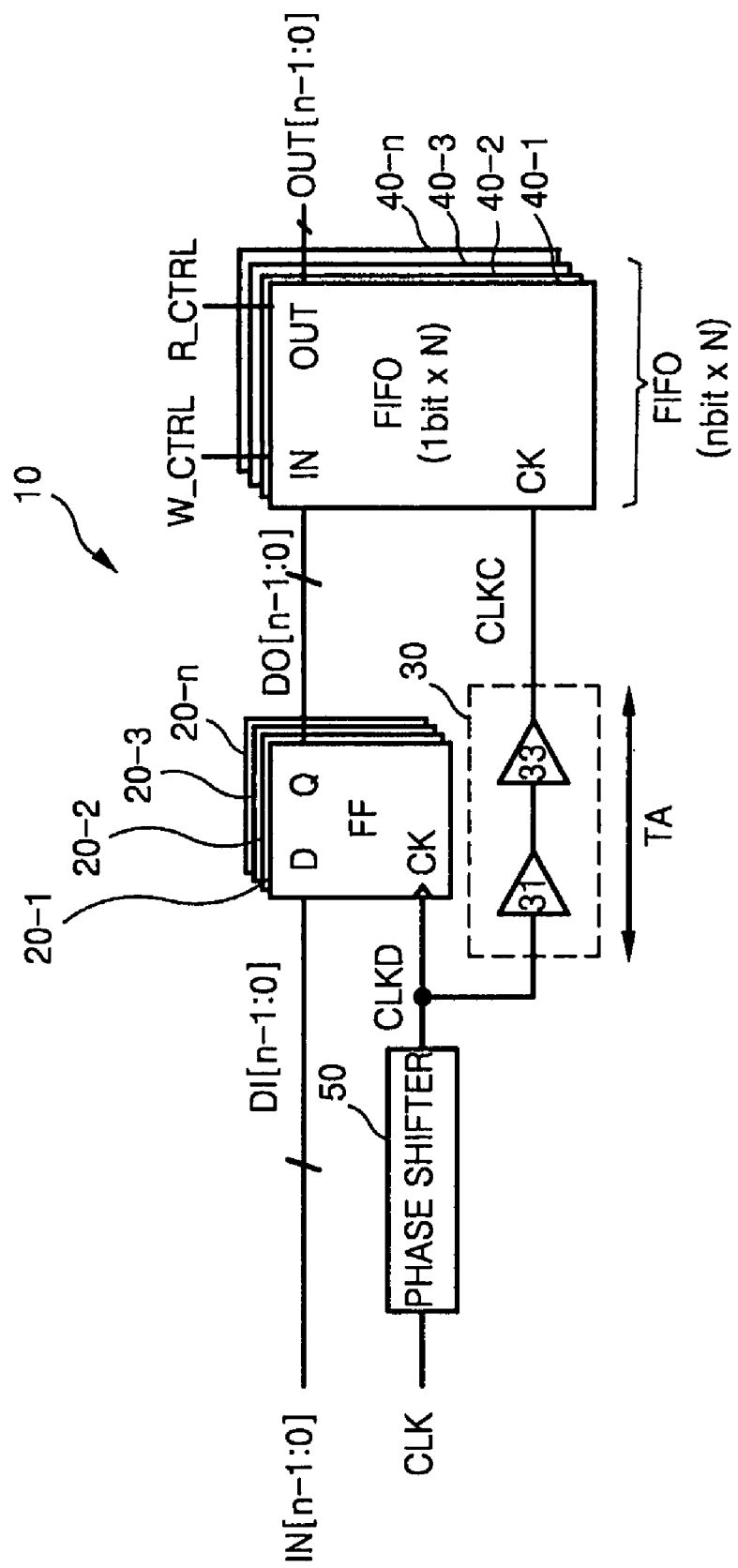
FIG. 1 is a functional block diagram of a data processing apparatus using a first-in first-out (FIFO) device according to an embodiment of the present invention.

The attached drawings illustrate preferred embodiments of the present invention, and are referred to in order to gain a sufficient understanding of the present invention, the merits thereof, and the objectives accomplished by the implementation of the present invention. Hereinafter, the present invention will be described in detail by explaining preferred embodiments of the invention with reference to the attached drawings. Like reference numerals in the drawings denote like elements.

FIG. 1 is a functional block diagram of a data processing apparatus 10 using a first-in first-out (FIFO) device according to an embodiment of the present invention. The data processing apparatus 10 includes a plurality of sampling circuits 20-1 through 20-n (where "n" is a natural number), a delay circuit 30, and a plurality of FIFO devices 40-1 through 40-n. The data processing apparatus 10 may optionally further include a phase shifter 50. Each of the sampling circuits 20-1 through 20-n can be implemented, for example, by an edge-triggered D flip-flop, however, alternative devices used for the sampling circuits are equally applicable to the embodiments and principles of the present invention.

Each of the sampling circuits 20-1 through 20-n captures a logic state (e.g., a logic high of "1" or a logic low of "0") of input data input through a corresponding line among "n" data lines in response to a first edge (e.g., a rising edge or falling edge) of a first clock signal CLKD, and holds the captured data. Such a capturing and holding operation is referred to as a latch. At this time, the input data DI[n−1:0] corresponds to delayed source data IN[n−1:0]. For the clarity of the description, delay caused by a data line or a buffer (not shown) is not considered.

The delay circuit 30 receives the first clock signal CLKD and delays it by a predetermined period of time, i.e., a delay time TA to output a second clock signal CLKC. For example, the delay circuit 30 may be implemented by a plurality of buffers connected in series. Referring to FIG. 1, the delay circuit 30 includes two buffers 31 and 33, but the number of buffers included in the delay circuit 30 is not restricted thereto. In an alternative embodiment, the delay circuit 30 can control the predetermined delay time TA in response to a control signal which is input from an external location.

Each of the FIFO devices 40-1 through 40-n processes the data, which is captured and held by each corresponding one of the sampling circuits 20-1 through 20-n, using a FIFO method in response to the first edge of the second clock signal CLKC output from the delay circuit 30, and outputs the processed data. Each of the FIFO devices 40-1 through 40-n can, for example, be implemented by an m-bit FIFO device having a depth N, where "m" is a natural number, for example, m=1, and N is a natural number. For example, an n-bit FIFO device having the depth N processes data DO[n−1:0], which are latched by the sampling circuits 20-1 through 20-n, using the FIFO method in response to the first edge of the second clock signal CLKC output from the delay circuit 30, and outputs processed data OUT[n−1:0].

The phase shifter 50 receives a data strobe signal CLK from a memory device, for example, a double data rate (DDR) memory device, a DDR2 memory device, a DDR3 memory device, a graphics DDR (GDDR) memory device, a GDDR2 memory device, or a GDDR3 memory device, and shifts the phase of the data strobe signal CLK by 90 degrees to generate the first clock signal CLKD. In other words, the phase shifter 50 generates the first clock signal CLKD having a phase that is shifted 90 degrees from that of the data strobe signal CLK. The data processing apparatus 10 performs functions as a controller that controls the operation of a predetermined memory device (not shown).

Figure 2:
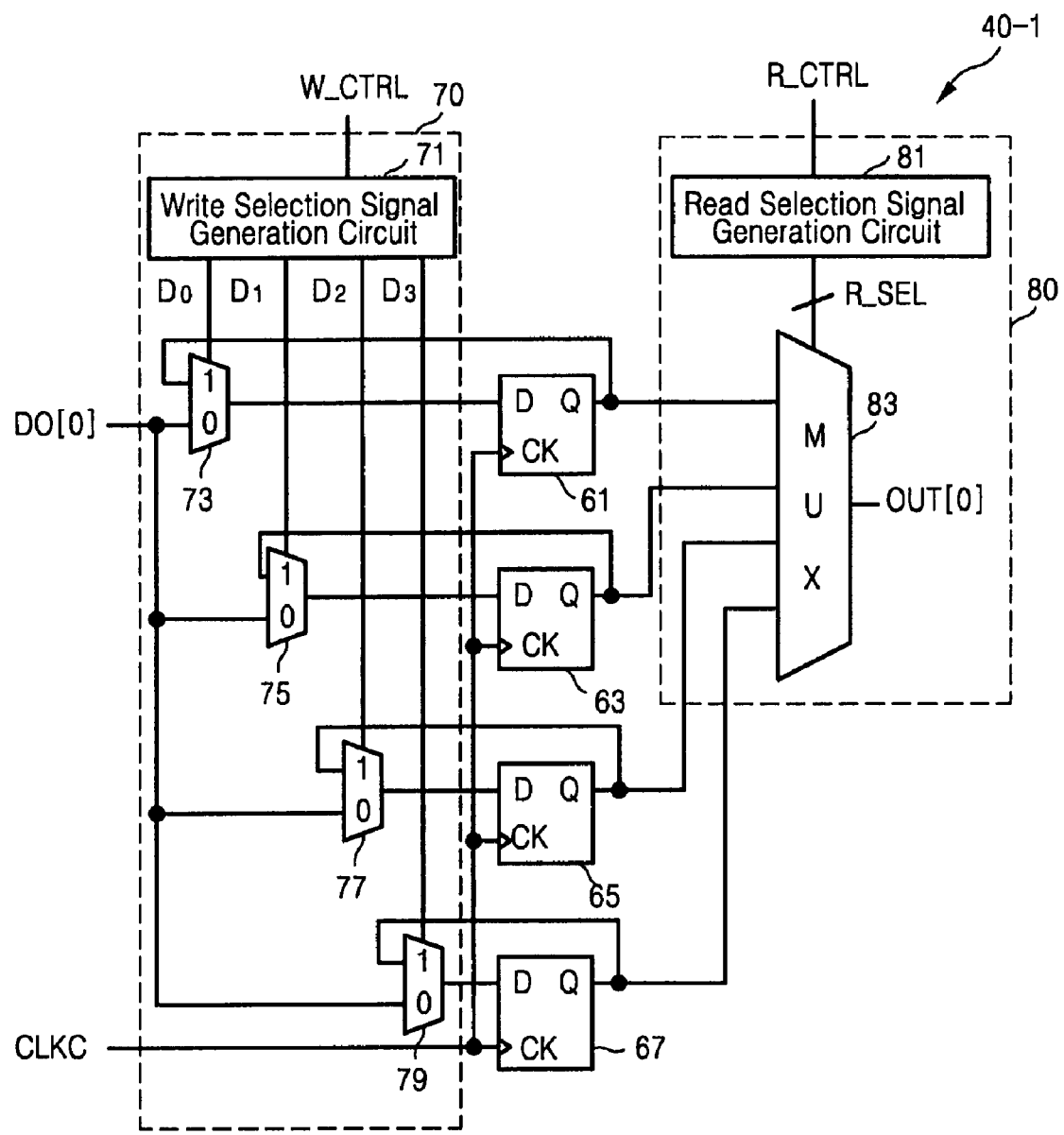
FIG. 2 is a detailed block diagram of the FIFO device illustrated in FIG. 1.

FIG. 2 is a detailed block diagram of the FIFO device 40-1 illustrated in FIG. 1. For the sake of clarity in the description, only one m-bit (e.g., m=1) FIFO device 40-1 which processes input data DO[0], which is output from the flip-flop 20-1 latching data input through a corresponding one among the plurality of data lines, using the FIFO method, is illustrated. The 1-bit FIFO device 40-1 has a depth 4, which means that the FIFO device 40-1 includes four flip-flops 61, 63, 65, and 67. Accordingly, an n-bit FIFO device includes "n" 1-bit FIFO devices having the same structure as the 1-bit FIFO device 40-1 illustrated in FIG. 2, to process input data using the FIFO method. Where n is a natural number.

The FIFO device 40-1 includes a plurality of the flip-flops 61, 63, 65, and 67, a write control circuit 70, and a read control circuit 80. Each of the flip-flops 61, 63, 65, and 67 can, for example, be implemented using a rising-edge-triggered D flip-flop.

The write control circuit 70 transmits the input data DO[0] to an input terminal D of one flip-flop among the plurality of the flip-flops 61, 63, 65, and 67 in response to at least one write control signal W_CTRL. In the present example, input data DO[0] is representative of data that is transmitted through a single data line. The write control circuit 70 includes a write selection signal generation circuit 71 and a plurality of selection circuits 73, 75, 77, and 79.

The write selection signal generation circuit 71 outputs a plurality of write selection signals D0, D1, D2, and D3 in response to the write control signal W_CTRL. One flip-flop to which the input data DO[0] is input is selected from among the plurality of the flip-flops 61, 63, 65, and 67 according to a combination of logic states of the write selection signals D0, D1, D2, and D3. Accordingly, the write selection signal generation circuit 71 functions as a write pointer for selecting a flip-flop in which input data is stored.

Each of the selection circuits 73, 75, 77, and 79 can be implemented using a multiplexer, as shown in FIG. 2; however, other devices are equally applicable to the embodiments of the present invention, and the present invention is not limited thereto. Each of the selection circuits 73, 75, 77, and 79 includes a first terminal represented by "0" to receive the input data DO[0]; a second terminal represented by "1" to receive output data from a corresponding one among the flip-flops 61, 63, 65, and 67; and an output terminal to output either the input data DO[0] input through the first terminal "0" or the output data input through the second terminal "1" to an input terminal D of the corresponding one of the flip-flops 61, 63, 65, and 67 in response to a corresponding signal among the write selection signals D0, D1, D2, and D3.

One of the flip-flops 61, 63, 65, and 67 captures data output from the write control circuit 70 in response to the first edge of the second clock signal CLKC. For example, when the combination of the logic states of the write selection signals D0, D1, D2, and D3 is "0111", the flip-flop 61, in this example embodiment, latches the input data DO[0] in synchronization with the first edge of the second clock signal CLKC. When the combination of the logic states of the write selection signals D0, D1, D2, and D3 is "1110", the flip-flop 67 latches the input data DO[0] in synchronization with the first edge of the second clock signal CLKC.

The read control circuit 80 outputs data, which is captured by one of the flip-flops 61, 63, 65, and 67, as output data OUT[0] in response to at least one read control signal R_CTRL. The read control circuit 80 includes a read selection signal generation circuit 81 and a selection circuit 83. The read selection signal generation circuit 81 outputs a plurality of read selection signals R_SEL in response to the read control signal R_CTRL. In one example, the read selection signals R_SEL includes n-bit selection signals. The read selection signal generation circuit 81 functions as a read pointer for selecting a flip-flop, in which data to be output is stored, from among the flip-flops 61, 63, 65, and 67.

The selection circuit 83 outputs the data, which is captured by one of the flip-flops 61, 63, 65, and 67, as the output data OUT[0] in response to the plurality of read selection signals R_SEL. In the present embodiment, the selection circuit 83 is implemented by a multiplexer which outputs the data captured by one of the four flip-flops 61, 63, 65, and 67, as the output data OUT[0] in response to a 2-bit read selection signal R_SEL.

Figure 3:
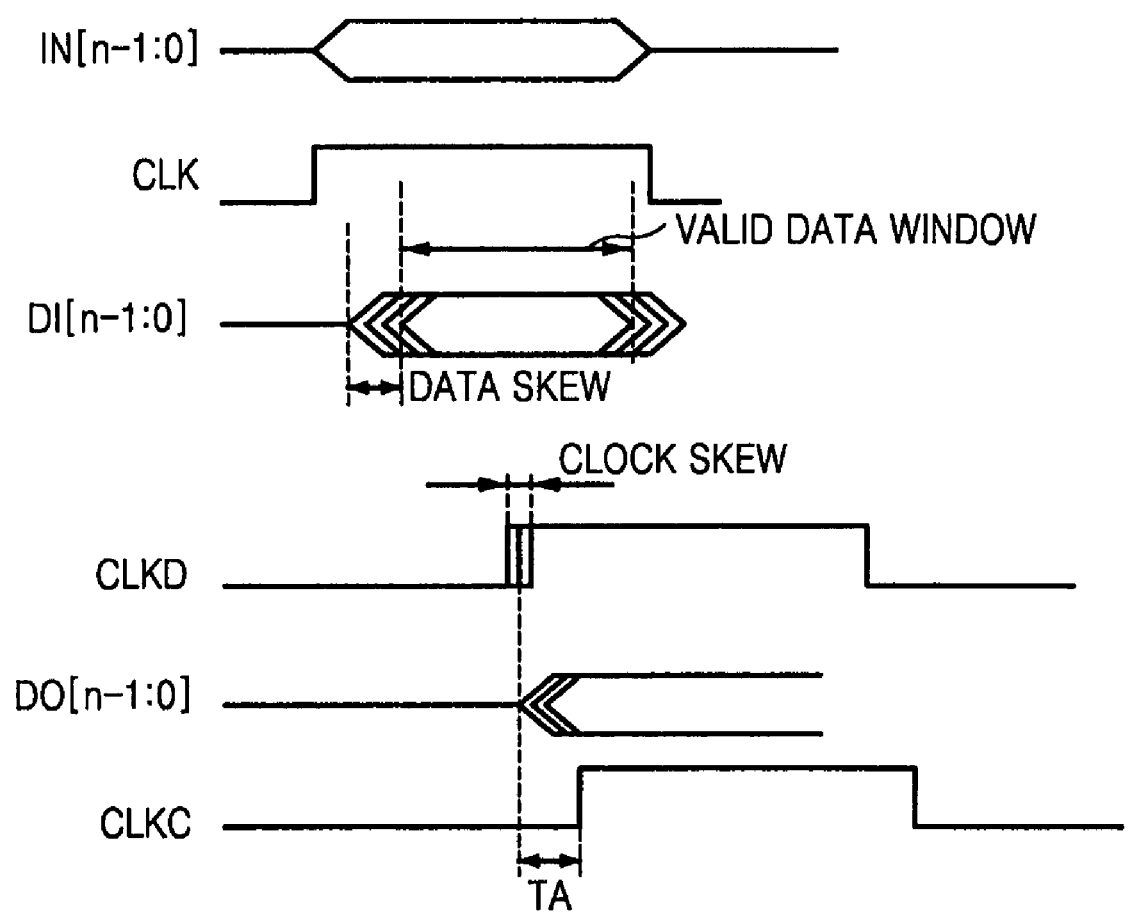
FIG. 3 illustrates waveforms of signals in the data processing apparatus illustrated in FIG. 1.

FIG. 3 illustrates example waveforms of signals in the data processing apparatus 10 illustrated in FIG. 1. Referring to FIG. 3, when the input data DO[0] input through one data line is processed using only the FIFO device 40-1, it is necessary to adjust clock skew with respect to the second clock signal CLKC, which is input to each clock terminal CK of the flip-flops 61, 63, 65, and 67, and to adjust data skew with respect to the input data DO[0], which is input to each input terminal D of the flip-flops 61, 63, 65, and 67, in order to increase the read margin of the input data DO[0]. With any increase in the data skew, the length of the valid data window decreases.

However, when the flip-flops 20-1 through 20-$n$, which are operable to buffer input data, are respectively provided before the FIFO devices 40-1 through 40-$n$, as illustrated in FIG. 1, each of the flip-flops 20-1 through 20-$n$ samples or latches its input data in response to a rising edge of the first clock signal CLKD. Also, the delay circuit 30 delays the first clock signal CLKD by the predetermined delay time TA and generates the second clock signal CLKC. The input data DI[n−1:0] that are respectively sampled or latched by the flip-flops 20-1 through 20-$n$ are respectively input to the FIFO devices 40-1 through 40-$n$. Accordingly, the FIFO devices 40-1 through 40-$n$ process the input data DI[n−1:0] using the FIFO method in response to at least one of a first edge (e.g., a rising edge) and a second edge (e.g., a falling edge) of the second clock signal CLKC, which is input to each clock terminal CK of the FIFO devices 40-1 through 40-$n$. Accordingly, the data skew can be reduced by controlling the delay time TA of the delay circuit 30 according to the design of the data processing apparatus 10.

In other words, in the data processing apparatus 10 including the plurality of the flip-flops 20-1 through 20-$n$ and the delay circuit 30, the skew between data input to each input terminal D of the flip-flops 20-1 through 20-$n$ and the clock signal input to each clock terminal CK thereof is the only one that needs to be controlled, regardless of the depth of the FIFO devices 40-1 through 40-$n$.

Figure 4:
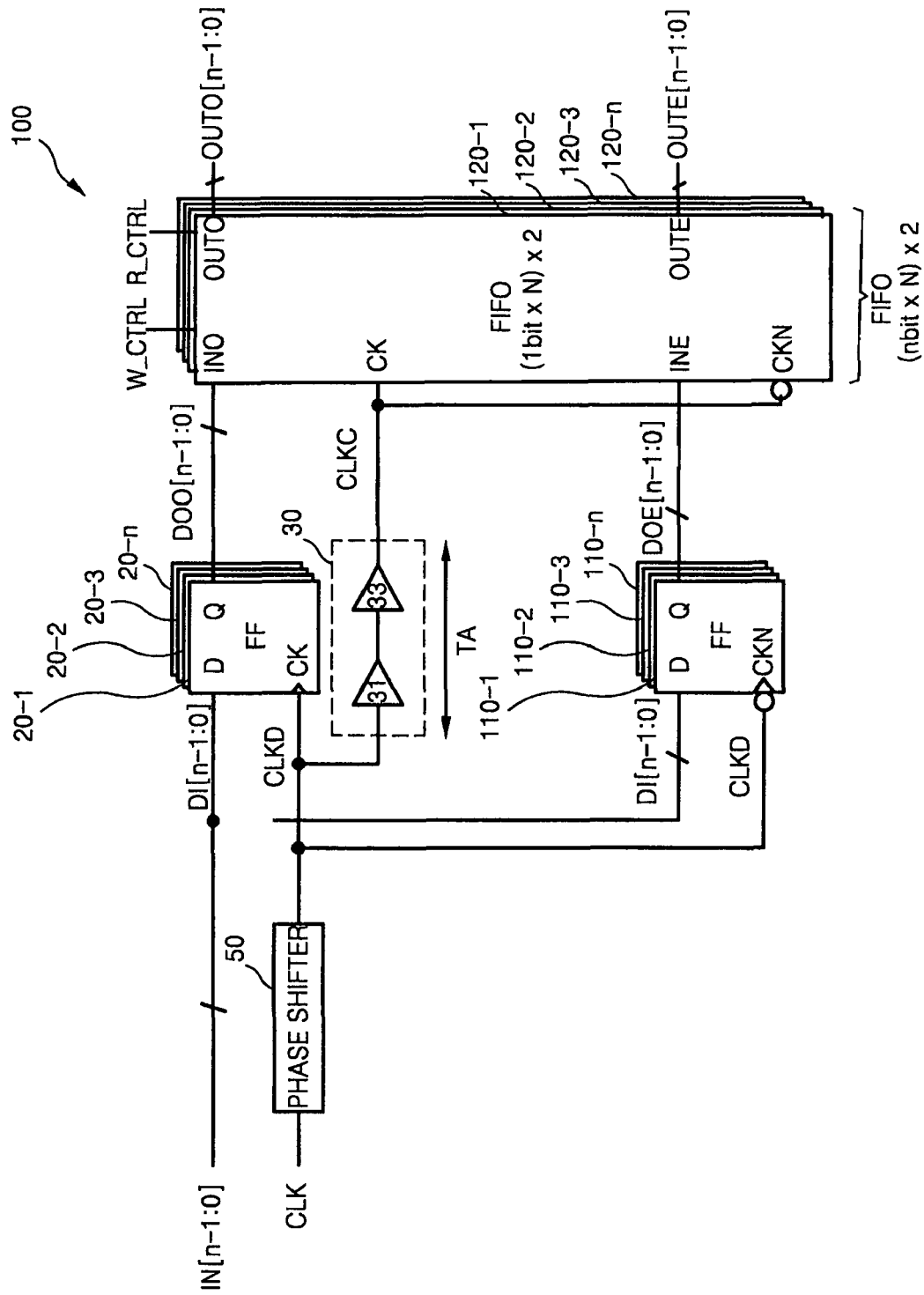
FIG. 4 is a functional block diagram of a data processing apparatus using a FIFO device according to another embodiment of the present invention.

FIG. 4 is a functional block diagram of a data processing apparatus 100 for processing data using a FIFO device according to another embodiment of the present invention. Referring to FIG. 4, the data processing apparatus 100 includes a plurality of first sampling circuits 20-1 through 20-$n$, the delay circuit 30, a plurality of second sampling circuits 110-1 through 110-$n$, and a plurality of FIFO devices 120-1 through 120-$n$. The data processing apparatus 100 can optionally further include a phase shifter 50.

In one example, the data processing apparatus 100 is an apparatus that can transmit and receive predetermined data to and from a device which processes data at a double data rate, such as a DDR memory device, a DDR2 memory device, a DDR3 memory device, a GDDR memory device, a GDDR2 memory device, or a GDDR3 memory device. In addition, the data processing apparatus 100 can be used as a controller which controls a device that processes data at the double data rate.

Each of the first sampling circuits 20-1 through 20-$n$ captures a logic level of input data input through its input terminal D in response to a first edge (e.g., a rising edge or falling edge)

of the first clock signal CLKD and holds the captured logic level. In one example, each of the first sampling circuits 20-1 through 20-n may be implemented by an edge-triggered D flip-flop; however, alternative devices are equally applicable to the embodiments and principles of the present invention.

The delay circuit 30 delays the first clock signal CLKD by the predetermined delay time TA and generates the second clock signal CLKC.

Each of the second sampling circuits 110-1 through 110-n captures a logic level of input data input through its input terminal D in response to a second edge (e.g., a falling edge or rising edge) of the first clock signal CLKD and holds the captured logic level. In one example, each of the second sampling circuits 110-1 through 110-n may be implemented by an edge-triggered D flip-flop; however, alternative devices are equally applicable to the embodiments and principles of the present invention.

Each of the FIFO devices 120-1 through 120-n processes a corresponding one data element among data DOO[n−1:0], which are respectively latched by the first sampling circuits 20-1 through 20-n, using the FIFO method in response to the first edge of the second clock signal CLKC. In one example, the data DOO[n−1:0] respectively latched by the first sampling circuits 20-1 through 20-n may be odd-numbered data among the input data DI[n−1:0]. In addition, each of the FIFO devices 120-1 through 120-n processes corresponding one data among data DOE[n−1:0], which are respectively latched by the second sampling circuits 110-1 through 110-n, using the FIFO method in response to the second edge of the second clock signal CLKC. In one example, the data DOE[n−1:0] respectively latched by the second sampling circuits 110-1 through 110-n may be even-numbered data among the input data DI[n−1:0].

Figure 5:
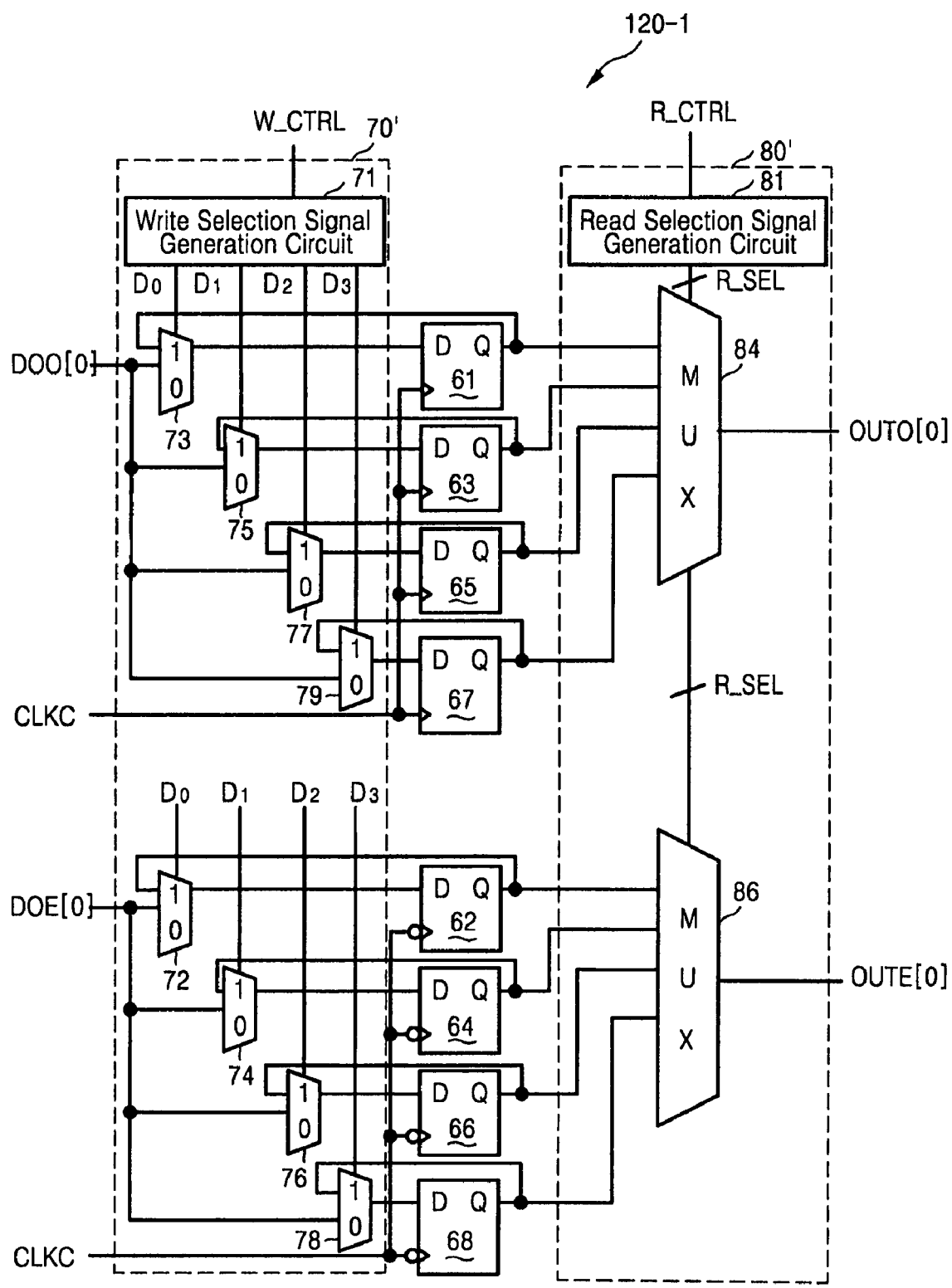
FIG. 5 is a detailed block diagram of the FIFO device illustrated in FIG. 4.

FIG. 5 is a detailed block diagram of the FIFO device 120-1 illustrated in FIG. 4. For the sake of clarity in the description, only one FIFO device 120-1 which processes data DOO[0] and data DOE[0] which are respectively output from the sampling circuits 20-1 and 110-1 is illustrated. In order to process n-bit data, "n" FIFO devices, each having the same structure as the FIFO device 120-1 illustrated in FIG. 5, are used.

The FIFO device 120-1 includes a plurality of first flip-flops 61, 63, 65, and 67; a plurality of second flip-flops 62, 64, 66, and 68; a write control circuit 70'; and a read control circuit 80'. Each of the first flip-flops 61, 63, 65, and 67 can, for example, be implemented using a first edge-triggered D flip-flop. Each of the first flip-flops 61, 63, 65, and 67 latches data input to the input terminal D in response to or in synchronization with the first edge of the second clock signal CLKC.

Each of the second flip-flops 62, 64, 66, and 68 can, for example, be implemented by a second edge-triggered D flip-flop. In one example embodiment, the first edge is one of a rising edge and a falling edge and the second edge is the other one of them. Each of the second flip-flops 62, 64, 66, and 68 latches data input to the input terminal D in response to or in synchronization with the second edge of the second clock signal CLKC.

The write control circuit 70' transmits the n-th input data DOO[0] latched by the first flip-flop 20-1 to the input terminal D of at least one of the first flip-flops 61, 63, 65, and 67 in response to at least one write control signal W_CTRL. In addition, the write control circuit 70' transmits the (n+1)-th input data DOE[0] latched by the second flip-flop 110-1 to the input terminal D of at least one of the second flip-flops 62, 64, 66, and 68 in response to the at least one write control signal W_CTRL.

The write control circuit 70' includes the write selection signal generation circuit 71 and a plurality of selection circuits 72 through 79. The write selection signal generation circuit 71 generates a plurality of write selection signals D0, D1, D2, and D3 in response to the at least one write control signal W_CTRL. The write selection signal generation circuit 71 functions as a pointer for selecting a flip-flop to which data is input.

Each of the selection circuits 72 through 79 selectively outputs either data which is input to the first input terminal "0" or data which is input to the second input terminal "1" in response to a corresponding one of the write selection signals D0, D1, D2, and D3. Each of the selection circuits 72 through 79 can be implemented using a multiplexer, as shown in FIG. 5; however, other devices are equally applicable to the embodiments of the present invention and the invention is not limited thereto.

In particular, at least one of the selection circuits 73, 75, 77, and 79 outputs the n-th input data DOO[0] latched by the first flip-flop 20-1 in response to a corresponding one of the write selection signals D0, D1, D2, and D3. In addition, at least one of the selection circuits 72, 74, 76, and 78 outputs the (n+1)-th input data DOE[0] latched by the second flip-flop 110-1 in response to a corresponding one of the write selection signals D0, D1, D2, and D3. For example, the selection circuit 73 outputs the n-th input data DOO[0] or data output from the flip-flop 61 to the input terminal D of the flip-flop 61 in response to the selection signal D0. The selection circuit 72 also outputs the (n+1)-th input data DOE[0] or data output from the flip-flop 62 to the input terminal D of the flip-flop 62 in response to the selection signal D0.

The read control circuit 80' outputs either data latched by one of the first flip-flops 61, 63, 65, and 67 or data latched by one of the second flip-flops 62, 64, 66, and 68 in response to at least one read control signal R_CTRL. The read control circuit 80' includes the read selection signal generation circuit 81 and a plurality of selection circuits 84 and 86. In one example embodiment, the read selection signal generation circuit 81 generates read selection signals R_SEL in response to the at least one read control signal R_CTRL. The read selection signal generation circuit 81 can function as a pointer for selecting a flip-flop, in which data to be read is stored.

The selection circuit 84 selectively outputs data, which is stored in one of the first flip-flops 61, 63, 65, and 67, as output data OUTO[0] in response to the read selection signals R_SEL. The selection circuit 84 also selectively outputs data, which is stored in one of the second flip-flops 62, 64, 66, and 68, as output data OUTE[0] in response to the read selection signals R_SEL.

The read control circuit 80' can optionally include a single selection circuit instead of the plurality of the selection circuits 84 and 86. In this case, the single selection circuit may selectively output data, which is stored in one of the plurality of flip-flops 61 through 68, in response to the read selection signals R_SEL.

In a manner similar to the FIFO device 120-1, the FIFO device 120-2 processes data (e.g., DOO[1] and DOE[1]), which are respectively output from the flip-flops 20-2 and 110-2, using the FIFO method. Also, the FIFO device 120-3 processes data (e.g., DOO[2] and DOE[2]), which are respectively output from the flip-flops 20-3 and 110-3, using the FIFO method. The FIFO device 120-n likewise processes data (e.g., DOO[n−1] and DOE[n−1]), which are respectively output from the flip-flops 20-n and 110-n, using the FIFO method. In the description, "m" and "n" indicating a natural number are used for the clarity of the description.

As described above, according to the present invention, data skew can be reduced. Accordingly, the length of the valid data window for the device is increased. With an increased-length valid data window, reliability of the data processing apparatus is also increased. In addition, the number of points requiring skew control in a data processing apparatus that employs a FIFO device according to the present invention is the same as that in a data processing apparatus that does not employ the FIFO device, and therefore, the embodiments of the present invention are advantageous in that it is not necessary to adjust skew when data processing apparatuses including FIFO devices having different depths, respectively, are designed. As a result, design of a data processing apparatus can be relatively simple.

While the present invention has been particularly shown and described with reference to exemplary embodiments thereof, it will be understood by those of ordinary skill in the art that various changes in form and detail may be made herein without departing from the spirit and scope of the present invention as defined by the following claims.

What is claimed is:

1. A data processing apparatus comprising:
   a first sampling circuit that samples a logic state of input data in response to a first edge of a first clock signal and that holds a result of the sampling;
   a second sampling circuit that samples a logic state of the input data in response to a second edge of the first clock signal and that holds a result of the sampling;
   a delay circuit that delays the first clock signal by a predetermined delay time and that outputs a second clock signal; and
   a first-in first-out (FIFO) device that processes the result of the sampling output from the first sampling circuit using a FIFO method in response to a first edge of the second clock signal output from the delay circuit and processes the result of the sampling output from the second sampling circuit using the FIFO method in response to a second edge of the second clock signal output from the delay circuit.

2. The data processing apparatus of claim 1, further comprising a phase shifter that receives a data strobe signal and that generates the first clock signal, a phase of which is shifted 90 degrees relative to a phase of the data strobe signal.

3. The data processing apparatus of claim 1, wherein each of the first sampling circuit and the second sampling circuit comprises a flip-flop.

4. The data processing apparatus of claim 1, wherein the FIFO device comprises:
   a plurality of first edge-triggered flip-flops, each of which latches data input through an input terminal in response to the first edge of the second clock signal;
   a write control circuit that transmits the input data to the input terminal of a corresponding one of the first edge-triggered flip-flops in response to at least one write control signal; and
   a read control circuit that outputs data, which is latched by a corresponding one of the first edge-triggered flip-flops, as output data in response to at least one read control signal.

5. The data processing apparatus of claim 4, wherein the write control circuit comprises:
   a write selection signal generation circuit that outputs a plurality of write selection signals in response to the at least one write control signal; and
   a plurality of selection circuits each of which comprises a first terminal that receives the input data, a second terminal that receives data output from a corresponding flip-flop among the first edge-triggered flip-flops, and an output terminal that outputs one of the input data input to the first terminal and the data input to the second terminal to the input terminal of a corresponding one of the first edge-triggered flip-flops in response to a corresponding selection signal among the plurality of write selection signals.

6. The data processing apparatus of claim 4, wherein the read control circuit comprises:
   a read selection signal generation circuit that outputs a plurality of read selection signals in response to the at least one read control signal; and
   a selection circuit that outputs data, which is latched by the corresponding one of the first edge-triggered flip-flops, in response to the plurality of read selection signals.

7. The data processing apparatus of claim 1, wherein the FIFO device comprises:
   a plurality of first edge-triggered flip-flops each of which latches data input through an input terminal in response to the first edge of the second clock signal;
   a plurality of second edge-triggered flip-flops each of which latches data input through an input terminal in response to the second edge of the second clock signal;
   a write control circuit that transmits the input data, which is latched by the first sampling circuit, to the input terminal of at least one of the first edge-triggered flip-flops, and that transmits the input data, which is latched by the second sampling circuit, to the input terminal of at least one of the second edge-triggered flip-flops in response to at least one write control signal; and
   a read control circuit that outputs data latched by one of the first edge-triggered flip-flops or data latched by one of the second edge-triggered flip-flops in response to at least one read control signal.

8. The data processing apparatus of claim 1, wherein the apparatus comprises a controller that controls a device that processes data at a double data rate.

9. A data processing apparatus comprising:
   a plurality of first flip-flops each of which latches input data, which is input through an input terminal, in response to a first edge of a first clock signal;
   a plurality of second flip-flops the input terminals of which are respectively connected to the input terminal of the first flip-flops, each of the second flip-flops latching the input data, which is input through an input terminal, in response to a second edge of the first clock signal;
   a delay circuit that receives the first clock signal and that delays the received first clock signal by a predetermined delay time to output a second clock signal; and
   a first-in first-out (FIFO) device that processes data output from the plurality of first flip-flops using a FIFO method in response to a first edge of the second clock signal output from the delay circuit and processes data output from the second flip-flops using the FIFO method in response to a second edge of the second clock signal output from the delay circuit.

10. The data processing apparatus of claim 9, wherein the first edge is one of a rising edge and a falling edge and the second edge is the other one of the rising edge and the falling edge.

11. A data processing apparatus comprising:
   a first flip-flop that latches a logic state of an n-th input data in response to a first edge of a first clock signal, where n is a natural number;
   a second flip-flop that latches a logic state of an (n+1)-th input data in response to a second edge of the first clock signal;

a delay circuit that receives the first clock signal and that delays the received first clock signal by a predetermined delay time to output a second clock signal; and a first-in first-out (FIFO) device that processes the data, which is latched by the first flip-flop, using a FIFO method in response to a first edge of the second clock signal output from the delay circuit, and that processes the data, which is latched by the second flip-flop, using the FIFO method in response to a second edge of the second clock signal.

12. The data processing apparatus of claim 11, wherein the FIFO device comprises:

a plurality of first edge-triggered flip-flops each of which latches data input through an input terminal in response to the first edge of the second clock signal;

a plurality of second edge-triggered flip-flops each of which latches data input through an input terminal in response to the second edge of the second clock signal;

a write control circuit that transmits the n-th input data, which is latched by the first flip-flop, to the input terminal of at least one of the first edge-triggered flip-flops and that transmits the (n+1)-th input data, which is latched by the second flip-flop, to the input terminal of at least one of the second edge-triggered flip-flops in response to at least one write control signal; and a read control circuit that outputs data latched by one of the first edge-triggered flip-flops or data latched by one of the second edge-triggered flip-flops in response to at least one read control signal.

13. The data processing apparatus of claim 11, further comprising a phase shifter that receives a data strobe signal and that generates the first clock signal, a phase of which is shifted 90 degrees relative to a phase of the data strobe signal.

14. A data processing method using a first-in first-out (FIFO) device, the method comprising:

latching a logic state of input data in response to a first edge of a first clock signal using a first flip-flop;

latching the input data in response to a second edge of the first clock signal using a second flip-flop;

generating a second clock signal by delaying the first clock signal by a predetermined delay time using a delay circuit;

receiving data latched using the first flip-flop in response to a first edge of the second clock signal and processing the data using the FIFO device using a FIFO method; and receiving data latched using the second flip-flop in response to a second edge of the second clock signal and processing the data using the FIFO device using the FIFO method.

* * * * *